United States Patent
Chen et al.

(10) Patent No.: US 9,577,631 B2
(45) Date of Patent: Feb. 21, 2017

(54) SINGLE POLE MULTI-THROW SWITCH

(71) Applicant: RichWave Technology Corp., Taipei (TW)

(72) Inventors: Chih-Sheng Chen, Taipei (TW); Ching-Wen Hsu, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 15/012,859

(22) Filed: Feb. 2, 2016

(65) Prior Publication Data

US 2016/0241236 A1 Aug. 18, 2016

(30) Foreign Application Priority Data

Feb. 13, 2015 (TW) .............................. 104104897 A

(51) Int. Cl.
| | | |
|---|---|---|
| H01P 5/12 | (2006.01) | |
| H03K 17/687 | (2006.01) | |
| H01P 1/15 | (2006.01) | |
| H01P 1/10 | (2006.01) | |

(52) U.S. Cl.
CPC ............ *H03K 17/6871* (2013.01); *H01P 1/10* (2013.01); *H01P 1/15* (2013.01)

(58) Field of Classification Search
CPC ........... H03K 17/6871; H01P 1/10; H01P 1/15
See application file for complete search history.

(56) References Cited

U.S. PATENT DOCUMENTS

| | | | | |
|---|---|---|---|---|
| 6,804,502 | B2 * | 10/2004 | Burgener | .................. H01P 1/15 257/341 |
| 7,307,490 | B2 * | 12/2007 | Kizuki | ................. H03K 17/693 333/101 |
| 7,492,238 | B2 * | 2/2009 | Nakatsuka | ................ H01P 1/15 333/101 |
| 7,515,882 | B2 * | 4/2009 | Kelcourse | ................ H01P 1/15 330/151 |
| 8,803,632 | B2 | 8/2014 | Takeuchi | |
| 2003/0003881 | A1 | 1/2003 | Anim-Appiah | |

FOREIGN PATENT DOCUMENTS

| | | |
|---|---|---|
| CN | 101465454 A | 6/2009 |
| CN | 201674474 U | 12/2010 |
| CN | 102468836 A | 5/2012 |
| CN | 103401531 A | 11/2013 |
| CN | 203775175 U | 8/2014 |
| CN | 203788253 U | 8/2014 |
| TW | 227074 | 7/1994 |

* cited by examiner

*Primary Examiner* — Kenneth B Wells
(74) *Attorney, Agent, or Firm* — Winston Hsu; Scott Margo

(57) ABSTRACT

A single-pole multi-throw switch includes a set of selection switches. The set of selection switches includes a set of primary switches, a first set and a second set of secondary switches. The primary set of switches includes a plurality of primary transistors coupled in series for transmitting radio frequency signals. The first set of secondary switches is coupled to the primary set of switches and includes a plurality of first secondary transistors coupled in series for transmitting the radio frequency signals when the primary transistors and the first secondary transistors are turned on. The second set of secondary switches is coupled to the primary set of switches and includes a plurality of second secondary transistors coupled in series for transmitting the radio frequency signals when the primary transistors and the second secondary transistors are turned on.

18 Claims, 4 Drawing Sheets

SINGLE POLE MULTI-THROW SWITCH

CROSS REFERENCE TO RELATED APPLICATION

This application claims priority of Taiwan application No. 104104897, which was filed on Feb. 13, 2015, and is included herein by reference.

TECHNICAL FIELD

This invention is related to a single-pole multi-throw switch, and more particularly, a single-pole multi-throw switch that can reduce circuit area.

BACKGROUND

FIG. 1 shows a single-pole multi-throw switch according to prior art. The single-pole multi-throw switch 100 includes four sets of selection switches 1101 to 1104 and the single-pole multi-throw switch 100 can transmit or receive signals required by the system by turning on one set of selection switch among the four sets of selection switches 1101 to 1104. For example, when the single-pole multi-throw switch 100 is applied to a wireless communication system, the four sets of selection switches 1101 to 1104 can be coupled to different wireless communication modules 1301 to 1304 respectively so the single-pole multi-throw switch 100 can be used to transmit radio frequency signals to the related wireless communication module.

Each set of selection switches 1101 to 1104 includes a plurality of selection transistors 120. When the system uses the single-pole multi-throw switch 100 to transmit signals, only one set of selection switches is turned on. For example, when the system uses the single-pole multi-throw switch 100 and the wireless communication module 1301 to transmit signals, the selection transistors 120 of the set of selection switches 1101 are turned on, and the selection transistors 120 of the other sets of selection switches 1102 to 1104 are all turned off. Each set of selection switches 1102 to 1104 includes 14 selection transistors 120. If the effective capacitance of each of the selection transistor 120 is C, then the effective capacitance of the set of selection switches 1102 will be the effective capacitance of 14 selection transistors 120 in series, that is C/14, and the effective capacitance of the sets of selection switches 1102-1104 will be 3C/14. Namely, when the system uses the set of selection switches 1101 to transmit signals, the effective capacitance of turned-off transistors of the sets of selection switches 1102 to 1104 is the parasitic capacitance and excessive parasitic capacitance can weaken the strength of the transmission signals. In addition, the sets of selection switches 1102-1104 may require a significant size of area, which can be conflict with the needs of mobile electronic devices.

Moreover, when the single-pole multi-throw switch 100 includes even more sets of selection switches, the required area will also increase. For example, according to the structure of the single-pole multi-throw switch 100 in FIG. 1, the size of area may increase significantly when the single-pole multi-throw switch 100 is expanded to include eight sets of selection switches. Therefore, how to reduce the parasitic capacitance and the required area of the single-pole multi-throw switch has become a critical issue to be solved.

SUMMARY

One embodiment of the present invention discloses a single-pole multi-throw switch. The single-pole multi-throw switch comprises a common terminal and a first set of selection switches. The common terminal is configured to transmit radio frequency signals. The first set of selection switches comprises a first set of primary switches, a first set of secondary switches and a second set of secondary switches. The first set of primary switches comprises a plurality of first primary transistors coupled in series and coupled to the common terminal. The first set of secondary switches is coupled to the first set of primary switches and a first transmission terminal. The first set of secondary switches comprises a plurality of first secondary transistors coupled in series and the first set of secondary switches is configured to transmit the radio frequency signals through the first set of primary switches, the first set of secondary switches, and the first transmission terminal when the first primary transistors and the first secondary transistors are turned on. The second set of secondary switches is coupled to the first set of primary switches and a second transmission terminal. The second set of secondary switches comprises a plurality of second secondary transistors coupled in series and the second set of secondary switches is configured to transmit the radio frequency signals through the first set of primary switches, the second set of secondary switches, and the second transmission terminal when the first primary transistors and the second secondary transistors are turned on. In addition, a number of the first secondary transistors and a number of the second secondary transistors are both greater than a number of the first primary transistors.

DETAILED DESCRIPTION

Figure 1:
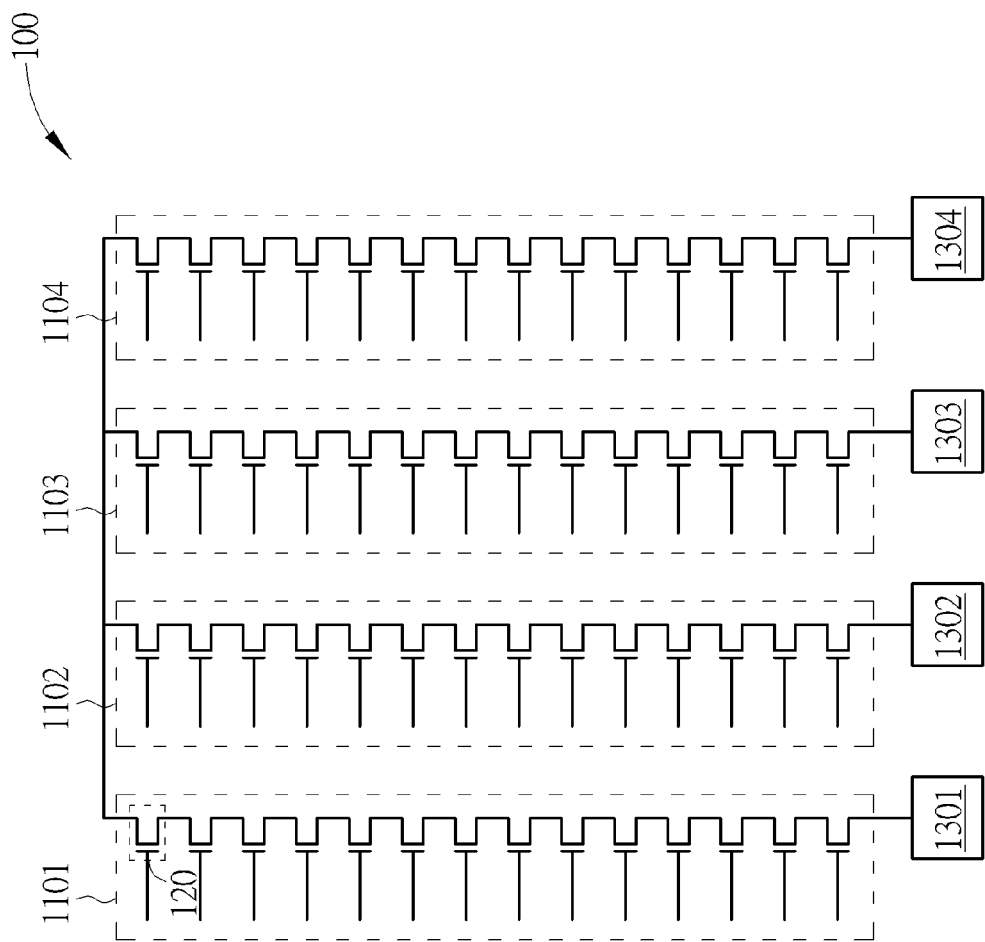
FIG. 1 shows a single-pole multi-throw switch according to prior art.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
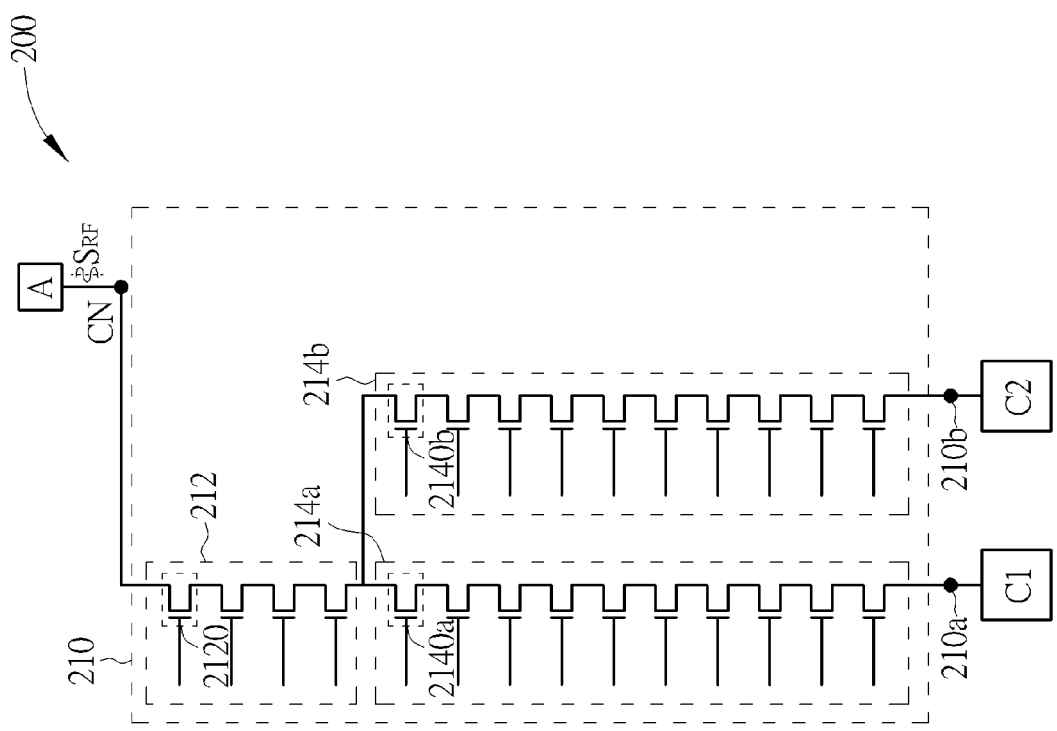
FIG. 2 shows a single-pole multi-throw switch according to one embodiment of the present invention.

FIG. 2 shows a single-pole multi-throw switch 200 according to one embodiment of the present invention. The single-pole multi-throw switch 200 includes a common terminal CN and a set of selection switches 210. The set of selection switches 210 includes a set of primary switches 212, a set of secondary switches 214a, and a set of secondary switches 214b. The common terminal CN can be used to transmit radio frequency signals $S_{RF}$. According to the embodiment in FIG. 2, the single-pole multi-throw switch 200 can be applied to a wireless communication system so the common terminal CN can be coupled to an antenna terminal A for receiving or transmitting radio frequency signals $S_{RF}$. However, this is not to limit the present invention.

The set of primary selection switches 212 can include a plurality of first primary transistors 2120 coupled in series and coupled to the common terminal CN. The set of secondary switches 214a can be coupled to the set of primary switches 212 and a transmission terminal 210a. The set of secondary switches 214a can include a plurality of secondary transistors 2140a coupled in series and can be configured to transmit the radio frequency signals $S_{RF}$ through the set of primary switches 212, the set of secondary switches 214a, and the transmission terminal 210a when the primary transistors 2120 and the secondary transistors 2140a are turned on. The set of secondary switches 214b can be coupled to the set of primary switches 212 and a transmission terminal 210b. The set of secondary switches 214b can include a plurality of secondary transistors 2140b coupled in series and can be configured to transmit the radio frequency signals $S_{RF}$ through the set of primary switches 212, the set of secondary switches 214b, and the transmission terminal 210b when the primary transistors 2120 and the secondary transistors 2140b are turned on. In some embodiments of the present invention, the primary transistors 2120, the secondary transistors 2140a and the secondary transistors 2140b can be P-type metal-oxide semiconductor transistors (PMOSs), NMOS or other kinds of transistors.

In some embodiments of the present invention, the transmission terminals 210a and 210b can be coupled to wireless radio frequency terminals C1 and C2 respectively so when the system needs to transmit the radio frequency signals $S_{RF}$ through the antenna terminal A and the wireless radio frequency terminal C1, the plurality of primary transistors 2120 and the plurality of secondary transistors 2140a can be turned on and the transmission terminal 210a can be used to transmit or receive the radio frequency signals $S_{RF}$ accordingly. Similarly, when the system needs to transmit the radio frequency signals $S_{RF}$ through the antenna terminal A and the wireless radio frequency terminal C2, the plurality of primary transistors 2120 and the plurality of secondary transistors 2140b can be turned on and the transmission terminal 210b can be used to transmit or receive the radio frequency signals $S_{RF}$ accordingly.

By sharing the primary transistors 2120, the circuit area required by the single-pole multi-throw switch 200 can be less than the circuit area required by the single-pole multi-throw switch of the prior art (such as the sets of selection switches 1101 and 1102 of the single-pole multi-throw switch 100).

To be even more specific, the plurality of secondary transistors 2140a can receive the same control signals for being turned on or turned off simultaneously, and plurality of secondary transistors 2140b can also receive the same control signals for being turned on or turned off simultaneously. When using the transmission terminal 210a to transmit the radio frequency signals $S_{RF}$, the plurality of secondary transistors 2140a can be turned on so the voltage endured by the plurality of the primary transistors 2120 and the plurality of secondary transistors 2140a can be the voltage amplitudes of the radio frequency signal $S_{RF}$. Also, since the plurality of secondary transistors 2140b will be turned off, the total voltage endured by the plurality of secondary transistors 2140b will be the same as the total voltage endured by the plurality of the secondary transistors 2140a. Since the radio frequency signals are usually high frequency signals with high voltage, to prevent the plurality of secondary transistors 2140b of the set of secondary switches 214b from unintentionally being turned on by the drastic variation of the radio frequency signals $S_{RF}$, a number of the secondary transistors 2140b of the set of secondary switches 214b can be greater than a number of the primary transistors 2120 of the set of primary switches 212 in some embodiments of the present invention. Similarly, a number of the secondary transistors 2140a of the set of secondary switches 214a can also be greater than the number of the primary transistors 2120 of the set of primary switches 212.

Figure 3:
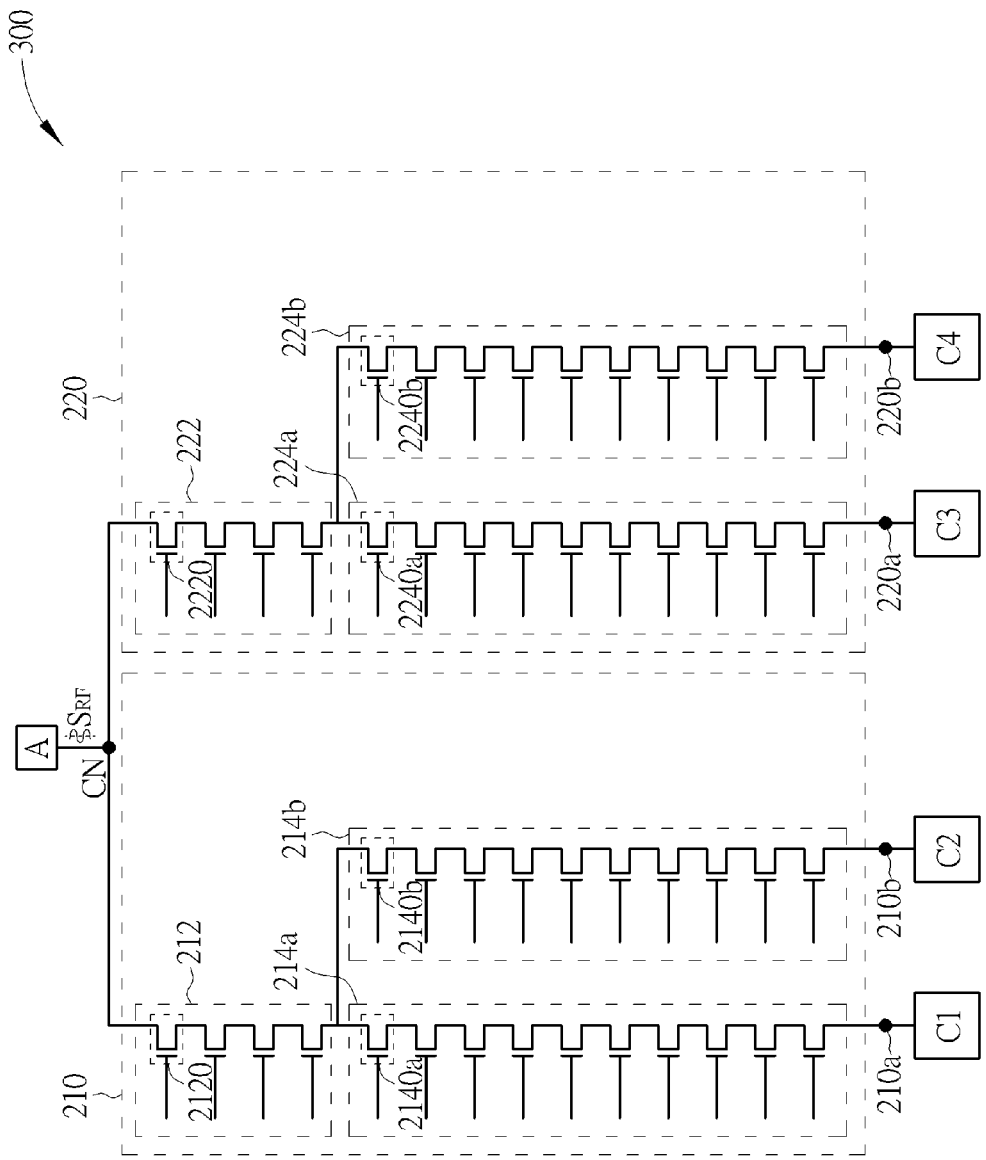
FIG. 3 shows a single-pole multi-throw switch according to another embodiment of the present invention.

FIG. 3 shows a single-pole multi-throw switch 300 according to another embodiment of the present invention. The single-pole multi-throw switch 300 can have a similar structure as the single-pole multi-throw switch 200. The difference is in that the single-pole multi-throw switch 300 not only includes the common terminal CN and the set of selection switches 210 but also includes a set of selection switches 220. The set of selection switches 220 includes a set primary switches 222, a set of secondary switches 224a, and a set of secondary switches 224b. The set of primary switches 222 can include a plurality of primary transistors 2220 coupled in series and coupled to the common terminal CN. The set of secondary switches 224a can be coupled to the set of primary switches 222 and a transmission terminal 220a. The set of secondary switches 224a can include a plurality of secondary transistors 2240a coupled in series and can be configured to transmit the radio frequency signals $S_{RF}$ through the set of primary switches 222, the set of secondary switches 224a, and the transmission terminal 220a when the primary transistors 2220 and the secondary transistors 2240a are turned on. The set of secondary switches 224b can be coupled to the set of primary switches 222 and a transmission terminal 220b. The set of secondary switches 224b can include a plurality of secondary transistors 2240b coupled in series and can be configured to transmit the radio frequency signals $S_{RF}$ through the set of primary switches 222, the set of secondary switches 224b, and the transmission terminal 220b when the primary transistors 2220 and the secondary transistors 2240b are turned on.

Since a total number of transistors in the single-pole multi-throw switch 300 is smaller than a total number of transistors in the single-pole multi-throw switch 100, the circuit area required by the single-pole multi-throw switch 300 can also be smaller than the circuit area required by the single-pole multi-throw switch 100.

In some embodiments of the present invention, the transmission terminals 210a, 210b, 220a and 220b can be coupled to the corresponding wireless radio frequency terminals C1, C2, C3 and C4 respectively so the transmission path of the radio frequency signals can be determined by turning on or off the transistors in the sets of selection switches 210 and 220. For example, when transmitting the radio frequency signals $S_{RF}$ through the antenna terminal A and the wireless radio frequency terminal C3, the plurality of primary transistors 2220 and the plurality of secondary transistors 2240a can be turned on, and the plurality of primary transistors 2120, the plurality of secondary transistors 2140a, 2140b, and 2240b can all be turned off so the transmission terminal 220a can be used to transmit or receive the radio frequency signals $S_{RF}$ accordingly. In this case, the total voltage endured by the plurality of secondary transistors 2240b will be the same as the total voltage endured by the plurality of the secondary transistors 2240a. Since the radio frequency signals are usually high frequency signals with high voltage, to prevent the plurality of secondary transistors 2240b of the set of secondary switches 224b from unintentionally being turned on by the drastic variation of the radio frequency signals $S_{RF}$, a number of the secondary transistors 2240b of the set of secondary switches 224b can be greater than a number of the primary transistors 2220 of the set of primary switches 222 in the present embodiment. Similarly, a number of the secondary transistors 2240*a* of the set of secondary switches 224*a* can also be greater than the number of the primary transistors 2220 of the set of primary switches 222.

In some embodiments of the present invention, when the single-pole multi-throw switch 300 turns on the primary transistors 2120 and the secondary transistors 2140*a* and turns off the primary transistors 2220, the secondary transistors 2140*b*, 2240*a*, and 2240*b*, the parasitic capacitance of the single-pole multi-throw switch 300 can be seen as the capacitance value of the effective capacitance of the set of secondary switches 214*b* in parallel with the effective capacitance of the set of selection switches 220. For example, if the effective capacitances of the secondary transistors 2140*a*, 2140*b*, 2240*a*, and 2240*b* are C, the effective capacitances of the primary transistors 2120 and 2220 are also C, the total numbers of the secondary transistors 2140*a*, 2140*b*, 2240*a*, and 2240*b* are all 10, and the total numbers of the primary transistors 2120 and 2220 are both 4, then the effective capacitance of the set of secondary switches 214*b* will be C/10, and the effective capacitance of the set of selection switches 220 will be the capacitance value of the effective capacitance of the set of secondary switches 224*a* (C/10) in parallel with the effective capacitance of the set of secondary switches 224*b* (C/10) and then together in series with the effective capacitance of the set of primary switches 222 (C/4), that is C/9. Consequently, in this case, the parasitic capacitance of the single-pole multi-throw switch 300 will be 19C/90, which is equal to the effective capacitance of the set of secondary switches 214*b* (C/10) in parallel with the effective capacitance of the set of selection switches 220 (C/9). Comparing to the prior art, the parasitic capacitance of the single-pole multi-throw switch 300 can also be smaller than the parasitic capacitance of the single-pole multi-throw switch 100, which is 3C/14.

Although in the aforesaid embodiments, the total numbers of the secondary switches 2140*a*, 2140*b*, 2240*a*, and 2240*b* are all 10, and the total numbers of the primary transistors 2120 and 2220 are both 4, this is not to limit the present invention. In other embodiments of the present invention, the total numbers of the secondary switches 2140*a*, 2140*b*, 2240*a*, and 2240*b* and the total numbers of the primary transistors 2120 and 2220 can also be other numbers. However, to reduce the parasitic capacitance more effectively for the single-pole multi-throw switch 300, the numbers of the secondary switches 2140*a* and 2140*b* can be two times greater than the number of the primary switches 2120, and the numbers of the secondary switches 2240*a* and 2240*b* can be two times greater than the number of the primary switches 2220.

In addition, in the aforesaid embodiments, the effective capacitances of each of the secondary transistors 2140*a*, 2140*b*, 2240*a*, and 2240*b* are C and the effective capacitances of each of the primary transistors 2120 and 2220 are also C, that is, the sizes of the secondary transistors 2140*a*, 2140*b*, 2240*a*, and 2240*b* can be the same as the sizes of the primary transistors 2120 and 2220; however, this is not to limit the present invention. In other embodiments of the present invention, the sizes of the secondary transistors 2140*a*, 2140*b*, 2240*a*, and 2240*b* can all be the same as each other, and the sizes of the primary transistors 2120 and 2220 can also be the same as each other. However, to reduce the turn-on resistance ($R_{DS(on)}$) on the transmission path and to avoid the required circuit area from increasing, the sizes of the secondary transistors 2140*a*, 2140*b*, 2240*a*, and 2240*b* can be different from the sizes of the primary transistors 2120 and 2220. For example, the sizes of the primary transistors 2120 and 2220 can be greater than the sizes of the secondary transistors 2140*a*, 2140*b*, 2240*a*, and 2240*b* so that the turn-on resistance of the primary transistors 2120 and 2220 can be smaller than the turn-on resistance of the secondary transistors 2140*a*, 2140*b*, 2240*a*, and 2240*b*, and the effective capacitances of the primary transistors 2120 and 2220 can be greater than the effective capacitances of the secondary transistors 2140*a*, 2140*b*, 2240*a*, and 2240*b*.

Furthermore, since the voltage endured by one transistor is inversely proportional to the effective capacitance of the transistor along the same turn-off path, one can increase the effective capacitances of the primary transistors 2120 and 2220 in some embodiments, for example, the effective capacitance of the primary transistor 2120 can be greater than the effective capacitances of the secondary transistor 2140*a* and 2140*b*, and the effective capacitance of the primary transistor 2220 can be greater than the effective capacitances of the secondary transistor 2240*a* and 2240*b* so that the voltages endured by the primary transistors 2120 and 2220 can be reduced, the possibility that the primary transistors 2120 and 2220 are in breakdown due to the high voltage signals can also be reduced, and the primary transistors 2120 and 2220 can be prevented from being turned on unintentionally by the drastic variation of the radio frequency signals $S_{RF}$. However, in other embodiments, the effective capacitance of the primary transistors 2120 and 2220 can also be decreased. For example, the effective capacitance of the primary transistor 2120 can be smaller than the effective capacitances of the secondary transistors 2140*a* and 2140*b*, and the effective capacitance of the primary transistor 2220 can be smaller than the effective capacitances of the secondary transistors 2240*a* and 2240*b* so that the voltages endured by the primary transistors 2120 and 2220 can be increased while the voltages endured by the secondary transistors 2140*a*, 2140*b*, 2240*a* and 2240*b* can be decreased so that the secondary transistors 2140*a*, 2140*b*, 2240*a* and 2240*b* can be prevented from being turned on unintentionally by the drastic variation of the radio frequency signals $S_{RF}$. To be even more specific, the single-pole multi-throw switch 300 can choose the primary transistors 2120 and 2220 and the secondary transistors 2140*a*, 2140*b*, 2240*a*, and 2240*b* to have appropriate effective capacitances and sizes according to the system need to enhance the system stability.

Moreover, to prevent the primary transistor 2120 from being in breakdown due to the large voltage, the breakdown voltage of each of the primary transistor 2120 can be greater than the breakdown voltage of each of the secondary transistor 2140*a* and 2140*b* in other embodiments. Similarly, the breakdown voltage of each of the primary transistor 2220 can also be greater than the breakdown voltage of each of the secondary transistor 2240*a* and 2240*b*

However, if the effective capacitances of the primary transistors 2120 and 2220 are excessively big, then the required circuit area and the parasitic capacitance of the single-pole multi-throw switch 300 may also be increased. Therefore, users can decide the appropriate sizes for the primary transistors and the secondary transistors according to the system need to optimize the transmission path of the single-pole multi-throw switch 300. In addition, to ensure each of transmission paths of the single-pole multi-throw switch 300 may have the same best optimized result, the number of the primary transistors 2120 and the number of the primary transistors 2220 can be the same and the numbers of the secondary transistors 2140*a*, 2140*b*, 2240*a*, and 2240*b* can be the same as each other.

Figure 4:
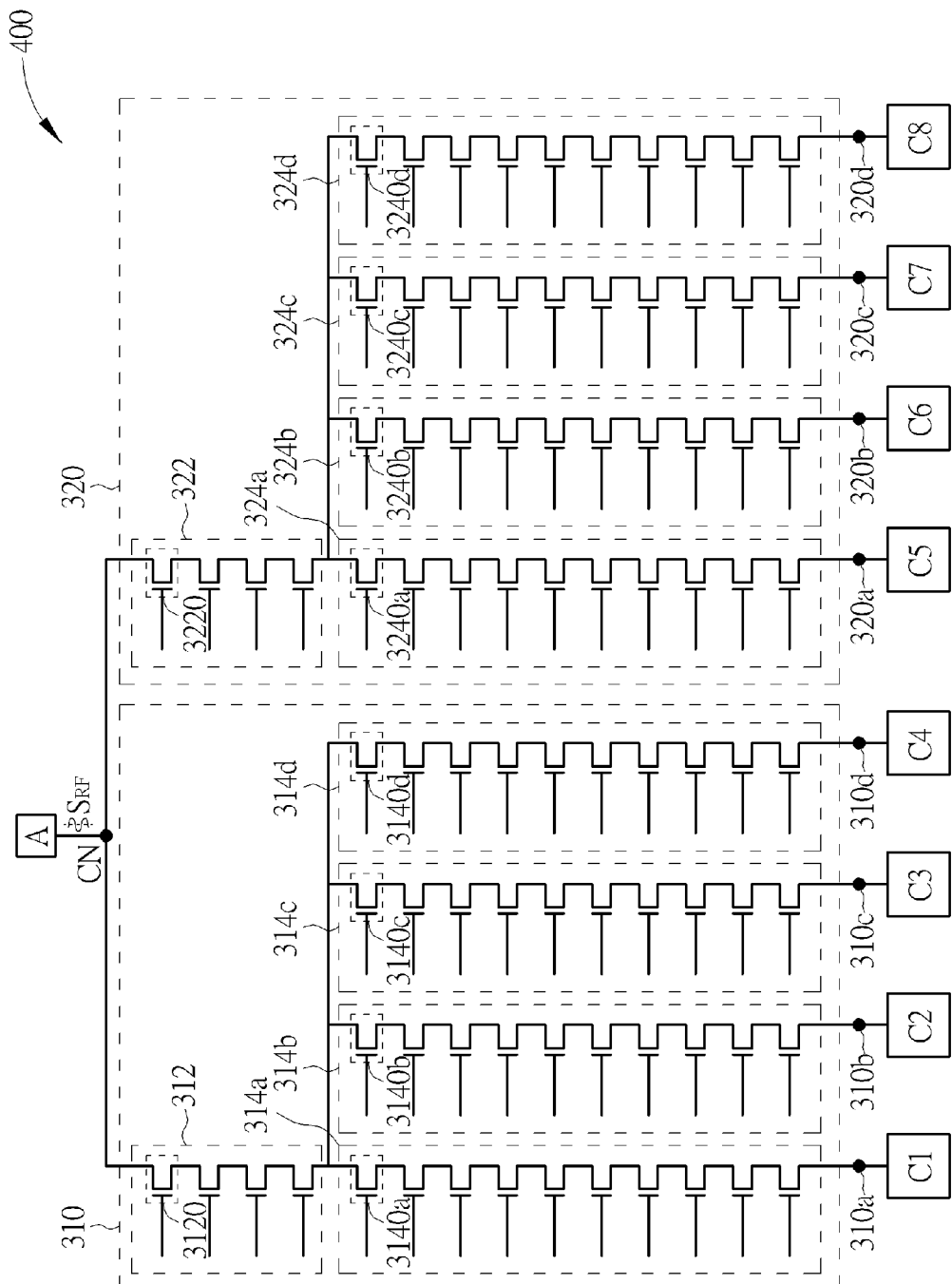
FIG. 4 shows a single-pole multi-throw switch according to another embodiment of the present invention.

Although the set of selection switches 210 of the single-pole multi-throw switch 200 includes two sets of secondary switches 214a and 214b, the present invention is not limited to this embodiment. In other embodiments of the present invention, the single-pole multi-throw switch 200 can also have other numbers of sets of selection switches and have other numbers of sets of secondary switches in one set of selection switches. FIG. 4 shows a single-pole multi-throw switch 400 according to another embodiment of the present invention. The single-pole multi-throw switch 400 includes the common terminal CN, a set of selection switches 310, and a set of selection switches 320. The set of selection switches 310 includes a set of primary switches 312, a set of secondary switches 314a, a set of secondary switches 314b, a set of secondary switches 314c, and a set of secondary switches 314d. The set of selection switches 320 includes a set of primary switches 322, a set of secondary switches 324a, a set of secondary switches 324b, a set of secondary switches 324c, and a set of secondary switches 324d. The four sets of the secondary switches 314a, 314b, 314c, and 314d can be coupled to the set of primary switches 312 and coupled to the transmission terminals 310a, 310b, 310c, and 310d respectively. The four sets of the secondary switches 314a, 314b, 314c, and 314d can respectively include a plurality of secondary transistors 3140a coupled in series, a plurality of secondary transistors 3140b coupled in series, a plurality of secondary transistors 3140c coupled in series, and a plurality of secondary transistors 3140d coupled in series. Taking the set of secondary switches 314a as example, when the plurality of primary transistors 3120 and the plurality of secondary transistors 3140a are tuned on, the single-pole multi-throw switch 400 can transmit the radio frequency signals $S_{RF}$ through the set of primary switches 312, the set of secondary switches 314a, and the transmission terminal 310a. The sets of secondary switches 314b, 314c, and 314d can have the same structures and same operation principles as the set of secondary switches 314a so the redundant explanation is saved. The set of selection switches 320 can have the same structure and same operational principle as the set of selection switches 310 so the redundant explanation is saved.

In some embodiments of the present invention, the transmission terminals 310a to 310d and 320a to 320d can be coupled to the wireless radio frequency terminal C1 to C8 correspondingly so that the path for transmitting the radio frequency signals $S_{RF}$ in the single-pole multi-throw switch 400 can be decided by turning on or turning off the transistors in the sets of selection switches 310 and 320. For example, when using the antenna terminal A and the wireless radio frequency terminal C3 to transmit the radio frequency signals $S_{RF}$, the plurality of primary transistors 3120 and the plurality of secondary transistors 3140c can be turned on and the plurality of primary transistors 3220 and the plurality of secondary transistors 3140a, 3140b, 3140d and 3240a to 3240d can all be turned off so the transmission terminal 310c can be used to transmit or receive the radio frequency signal $S_{RF}$ accordingly.

In some embodiments of the present invention, when the single-pole multi-throw switch 400 turns on the plurality of primary transistors 3120 and the plurality of secondary transistors 3140a and turns off the plurality of primary transistors 3220 and the plurality of secondary transistors 3140b to 3140d and 3240a to 3240d, the parasitic capacitance of the single-pole multi-throw switch 400 can been seen as the capacitance value of the effective capacitance of the three sets of secondary switches 314b to 314d in parallel with the effective capacitance of the set of selection switches 320. In some embodiments of the present invention, the sizes of the secondary transistors 3140a to 3140d and 3240a to 3240d can all be the same, and the sizes of the primary transistors 3120 and 3220 can be the same so that the effective capacitances of the secondary transistors 3140a to 3140d and 3240a to 3240d can all be the same as each other and the effective capacitances of the primary transistors 3120 and 3220 can also be the same as each other; however, the effective capacitances of the primary transistors 3120 and 3220 may be different from the effective capacitances of the secondary transistors 3140a to 3140d and 3240a to 3240d. For example, if the effective capacitance of the secondary transistors 3140a to 3140d and 3240a to 3240d are C, the effective capacitances of the primary transistors 3120 and 3220 can be 2C. In FIG. 4, the numbers of the secondary transistors 3140a to 3140d and 3240a to 3240d are all 10, and the numbers of the primary transistors 3120 and 3220 are both 4. The effective capacitance of the three sets of secondary switches 314d to 314d in parallel is equal to 3C/10 (where each set of secondary switches has effective capacitance of C/10), and the effective capacitance of the set of selection switches 320 can be seen as the capacitance value of the effective capacitance of the set of primary switches 322 (C/2) in series with the effective capacitance of the four sets of secondary switches 324a to 324d in parallel (4C/10) in total. Namely, the effective capacitance of the set of selection switches 320 is equal to the capacitance of C/2 in series with the capacitance of 4C/10 and has the resulted capacitance of 2C/9. Therefore, the parasitic capacitance of the single-pole multi-throw switch 400 can be the total effective capacitance of the three sets of secondary switches 314b to 314d (3C/10) in parallel with the effective capacitance of the set of selection switches 320 (2C/9), that is, the parasitic capacitance of the single-pole multi-throw switch 400 can be 47C/90. Comparing to the prior art, while the single-pole multi-throw switch 100 includes more sets of selection switches to provide eight different transmission paths for the system with the parasitic capacitance of 7C/14, the single-pole multi-throw switch 400 has its parasitic capacitor of 47C/90, which is about the same level as the single-pole multi-throw switch 100. However, since the sizes and effective capacitances of the primary transistors 3120 and 3220 are all greater than the sizes and the effective capacitances of the secondary transistors 3140a to 3140d and 3240a to 3240d, the turn-on resistance on the transmission path can be reduced and the voltage endured by the primary transistors 3120 and 3220 can also be reduced, which can prevent the primary switches 3120 and 3220 from being in breakdown and can prevent the primary switches 3120 and 3220 from being turned on unintentionally due to the drastic variation of radio frequency signals $S_{RF}$.

In the aforesaid embodiments, the effective capacitances of the primary transistors 3120 and 3220 can be two times greater than the effective capacitances of the secondary transistors 3140a to 3140d and 3240a to 3240d; however, this is not to limit the present invention. In other embodiments of the present invention, the effective capacitances of the primary transistors can be adjusted according to the system need. For example, if the system needs to further reduce the parasitic capacitance of the single-pole multi-throw switch and to reduce the required circuit area, the effective capacitances of the primary transistors 3120 and 3220 can be one times, one point five times or other number of times the effective capacitances of the secondary transistors 3140a to 3140d and 3240a to 3240d.

In addition, the number of the primary transistors 3120 and the number of the primary transistors 3220 can be the same and the numbers of the secondary transistors 3140a to 3140d and 3240a to 3240d can be the same as each other so that each of transmission paths of the single-pole multi-throw switch 400 may have the same best optimized result.

To provide eight different transmission paths in the single-pole multi-throw switch, the single-pole multi-throw switch 400 in FIG. 4 includes two sets of selection switches 310 and 320 and each set of selection switches 310 and 320 includes four sets of secondary switches 3140a to 3140d and 3240a to 3240d respectively. However, this is not to limit the present invention. In other embodiments of the present invention, the single-pole multi-throw switch can also include other numbers of sets of selection switches with other numbers of sets of secondary switches according to the system need. For example, the single-pole multi-throw switch can include four sets of selection switches and each set of selection switches can include two sets of secondary switches so that the single-pole multi-throw switch can still provide eight different transmission paths.

In summary, the single-pole multi-throw switches according to the embodiments of the present invention can reduce the circuit area, reduce the parasitic capacitance for avoiding the strength loss of the transmission signal, and prevent the transistors from being in breakdown or turned on unintentionally by sharing the primary transistors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A single-pole multi-throw switch, comprising:
   a common terminal configured to transmit radio frequency signals; and
   a first set of selection switches comprising:
      a first set of primary switches comprising a plurality of first primary transistors coupled in series and coupled to the common terminal;
      a first set of secondary switches coupled to the first set of primary switches and a first transmission terminal, the first set of secondary switches comprising a plurality of first secondary transistors coupled in series and configured to transmit the radio frequency signals through the first set of primary switches, the first set of secondary switches, and the first transmission terminal when the first primary transistors and the first secondary transistors are turned on; and
      a second set of secondary switches coupled to the first set of primary switches and a second transmission terminal, the second set of secondary switches comprising a plurality of second secondary transistors coupled in series and configured to transmit the radio frequency signals through the first set of primary switches, the second set of secondary switches, and the second transmission terminal when the first primary transistors and the second secondary transistors are turned on;
      wherein, a number of the first secondary transistors and a number of the second secondary transistors are both greater than a number of the first primary transistors.

2. The single-pole multi-throw switch of claim 1, further comprising
   a second set of selection switches, comprising:
      a second set of primary switches comprising a plurality of second primary transistors coupled in series and coupled to the common terminal;
      a third set of secondary switches coupled to the second set of primary switches and a third transmission terminal,
      the third set of secondary switches comprising a plurality of third secondary transistors coupled in series and configured to transmit the radio frequency signals through the second set of primary switches, the third set of secondary switches, and the third transmission terminal when the second primary transistors and the third secondary transistors are turned on; and
      a fourth set of secondary switches coupled to the second set of primary switches and a fourth transmission terminal, the fourth set of secondary switches comprising a plurality of fourth secondary transistors coupled in series and configured to transmit the radio frequency signals through the second set of primary switches, the fourth set of secondary switches, and the fourth transmission terminal when the second primary transistors and the fourth secondary transistors are turned on;
      wherein, a number of the third secondary transistors and a number of the fourth secondary transistors are both greater than a number of the second primary transistors.

3. The single-pole multi-throw switch of claim 2, wherein:
   effective capacitances of the first secondary transistors to the fourth secondary transistors are the same as effective of the first set of primary transistors to the second sets of primary transistors.

4. The single-pole multi-throw switch of claim 2, wherein:
   effective capacitances of the first secondary transistors to the fourth secondary transistors are the same, effective capacitances of the first primary transistors to the second primary transistors are the same, and the effective capacitances of the first primary transistors to the second primary transistors are greater or smaller than the effective capacitances of the first secondary transistors to the fourth secondary transistors.

5. The single-pole multi-throw switch of claim 2, wherein:
   sizes of the first secondary transistors to the fourth secondary transistors are the same as sizes of the first primary transistors to the second primary transistors.

6. The single-pole multi-throw switch of claim 2, wherein:
   sizes of the first secondary transistors to the fourth secondary transistors are the same, sizes of the first primary transistors to the second primary transistors are the same, and the sizes of the first primary transistors to the second primary transistors are greater or smaller than the sizes of the first secondary transistors to the fourth secondary transistors.

7. The single-pole multi-throw switch of claim 2, wherein:
   breakdown voltages of the first primary transistors to the second primary transistors are greater than breakdown voltages of the first secondary transistors to the fourth secondary transistors.

8. The single-pole multi-throw switch of claim 2, wherein:
   all sets of secondary switches have a same number of secondary transistors, and all sets of primary switches have a same number of primary transistors.

9. The single-pole multi-throw switch of claim 2, wherein:
   the common terminal is coupled to an antenna terminal and is configured to receive or transmit the radio frequency signals, and each of the transmission terminals is coupled to a corresponding wireless radio frequency terminal respectively and is configured to transmit or receive the radio frequency signals.

10. The single-pole multi-throw switch of claim 2, wherein:
the first set of selection switches further comprises:
a fifth set of secondary switches coupled to the first set of primary switches and a fifth transmission terminal, the fifth set of secondary switches comprising a plurality of fifth secondary transistors coupled in series and configured to transmit the radio frequency signals through the first set of primary switches, the fifth set of secondary switches, and the fifth transmission terminal when the first primary transistors and the fifth secondary transistors are turned on; and
a sixth set of secondary switches coupled to the first set of primary switches and a sixth transmission terminal, the sixth set of secondary switches comprising a plurality of sixth secondary transistors coupled in series and configured to transmit the radio frequency signals through the first set of primary switches, the sixth set of secondary switches, and the sixth transmission terminal when the first primary transistors and the sixth secondary transistors are turned on; and
the second set of selection switches further comprises:
a seventh set of secondary switches coupled to the second set of primary switches and a seventh transmission terminal, the seventh set of secondary switches comprising a plurality of seventh secondary transistors coupled in series and configured to transmit the radio frequency signals through the second set of primary switches, the seventh set of secondary switches, and the seventh transmission terminal when the second primary transistors and the seventh secondary transistors are turned on; and
an eighth set of secondary switches coupled to the second set of primary switches and a eighth transmission terminal, the eighth set of secondary switches comprising a plurality of eighth secondary transistors coupled in series and configured to transmit the radio frequency signals through the second set of primary switches, the eighth set of secondary switches, and the eighth transmission terminal when the second primary transistors and the eighth secondary transistors are turned on;
wherein, a number of the fifth secondary transistors and a number of the sixth secondary transistors are both greater than the number of the first primary transistors, and a number of the seventh secondary transistors and a number of the eighth secondary transistors are both greater than the number of the second primary transistors.

11. The single-pole multi-throw switch of claim 10, wherein:
effective capacitances of the first secondary transistors to the eighth secondary transistors are the same as effective capacitances of the first primary transistors to the second primary transistors.

12. The single-pole multi-throw switch of claim 10, wherein:
effective capacitances of the first secondary transistors to the eighth secondary transistors are the same, effective capacitances of the first primary transistors to the second primary transistors are the same, and the effective capacitances of the first primary transistors to the second primary transistors are greater or smaller than the effective capacitances of the first secondary transistors to the eighth secondary transistors.

13. The single-pole multi-throw switch of claim 10, wherein:
sizes of the first secondary transistors to the eighth secondary transistors are the same as sizes of the first primary transistors to the second primary transistors.

14. The single-pole multi-throw switch of claim 10, wherein:
sizes of the first secondary transistors to the eighth secondary transistors are the same, sizes of the first primary transistors to the second primary transistors are the same, and the sizes of the first primary transistors to the second primary transistors are greater or smaller than the sizes of the first secondary transistors to the eighth secondary transistors.

15. The single-pole multi-throw switch of claim 10, wherein:
breakdown voltages of the first primary transistors to the second primary transistors are greater than breakdown voltages of the first secondary transistors to the eighth secondary transistors.

16. The single-pole multi-throw switch of claim 10, wherein:
all sets of secondary switches have a same number of secondary transistors, and all sets of primary switches have a same number of primary transistors.

17. The single-pole multi-throw switch of claim 10, wherein:
the common terminal is coupled to an antenna terminal and is configured to receive or transmit the radio frequency signals, and each of the transmission terminals is coupled to a corresponding wireless radio frequency terminal respectively and is configured to transmit or receive the radio frequency signals.

18. The single-pole multi-throw switch of claim 1, wherein:
the common terminal is coupled to an antenna terminal and is configured to receive or transmit the radio frequency signals, and each of the transmission terminals is coupled to a corresponding wireless radio frequency terminal respectively and is configured to transmit or receive the radio frequency signals.

* * * * *

UNITED STATES PATENT AND TRADEMARK OFFICE
CERTIFICATE OF CORRECTION

PATENT NO. : 9,577,631 B2  
APPLICATION NO. : 15/012859  
DATED : February 21, 2017  
INVENTOR(S) : Chih-Sheng Chen et al.

It is certified that error appears in the above-identified patent and that said Letters Patent is hereby corrected as shown below:

On the Title Page

Item (54) and in the Specification, Column 1, Line 1, correct the title of the invention from "SINGLE POLE MULTI-THROW SWITCH" to --SINGLE-POLE MULTI-THROW SWITCH--

Signed and Sealed this  
Thirtieth Day of May, 2017

Michelle K. Lee  
*Director of the United States Patent and Trademark Office*